(12) United States Patent
Ganin et al.

(10) Patent No.: US 6,466,017 B1
(45) Date of Patent: *Oct. 15, 2002

(54) MRI SYSTEM WITH MODULAR GRADIENT SYSTEM

(75) Inventors: Alexander Ganin, Whitefish Bay; Kevin F. King, New Berlin, both of WI (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/453,274

(22) Filed: Dec. 2, 1999

(51) Int. Cl.[7] ................................................. G01V 3/00
(52) U.S. Cl. ....................... 324/318; 324/307; 324/320; 324/322
(58) Field of Search ................................. 324/318, 307, 324/309, 320, 322

(56) References Cited

U.S. PATENT DOCUMENTS

| | | | |
|---|---|---|---|
| 4,715,383 A | 12/1987 | Ehman et al. | 128/653 |
| 5,311,135 A | 5/1994 | Vavrek et al. | 324/318 |
| 5,657,757 A * | 8/1997 | Hurd et al. | 324/307 |
| 5,736,858 A | 4/1998 | Katnelson et al. | 324/318 |
| 6,078,175 A * | 6/2000 | Foo | 324/306 |
| 6,313,630 B1 * | 11/2001 | Ganin et al. | 324/312 |

* cited by examiner

Primary Examiner—Edward Lefkowitz
Assistant Examiner—Dixomara Vargas
(74) Attorney, Agent, or Firm—Quarles & Brady, LLP

(57) ABSTRACT

A magnetic resonance imaging system has a primary set of whole-body gradient coils and a supplemental set of gradient coils. The supplemental gradient coils are employed to produce imaging gradients when fast imaging pulse sequences are performed, and the primary set of gradient coils are employed when interleaved saturation or navigator signals pulse sequences are performed during a scan.

11 Claims, 3 Drawing Sheets

MRI SYSTEM WITH MODULAR GRADIENT SYSTEM

BACKGROUND OF THE INVENTION

The field of the invention is nuclear magnetic resonance imaging ("MRI") methods and systems. More particularly, the invention relates to the production of magnetic field gradients in MRI systems and their use in imaging pulse sequences.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. An NMR signal is emitted by the excited spins after the excitation signal $B_1$ is terminated and, this signal may be received and processed to form an image.

When utilizing NMR signals to produce images a technique is employed to obtain NMR signals from specific locations in the subject. Typically, the region which is to be imaged (region of interest) is scanned by a sequence of NMR measurement cycles which vary according to the particular localization method being used. The region of interest may be a small portion of a patient's anatomy, such as the head or heart, or a much larger portion, such as the entire thorax or spine. The resulting set of received NMR signals are digitized and processed to reconstruct the image using one of many well-known reconstruction techniques. To perform such a scan, it is, of course, necessary to elicit NMR signals from specific locations in the subject. This is accomplished by employing magnetic fields ($GX_x$, $G_y$, and $G_z$,) which have the same direction as the polarizing field $B_0$, but which have a gradient along the respective X, Y and Z axes. The magnetic field gradients are produced by a trio of coil assemblies placed around the object being imaged. By controlling the strength of these gradients during each NMR measurement cycle, the spatial distribution of spin excitation can be controlled and the location of the resulting NMR signals can be identified.

In order to accommodate the imaging of large portions of a patient, each gradient field coil must produce a magnet field that varies linearly along one axis of a very large volume. On the other hand, to image a small portion of a patient, each gradient field coil may be smaller in physical size and have entirely different electrical characteristics than the larger whole-body gradient coils.

There are many conflicting design considerations when providing an optimal gradient subsystem for an MRI system. Factors such as peak gradient amplitude, peak gradient slew rate, gradient spatial linearity over the imaging volume, heat generation and patient safety with respect to peripheral nerve stimulation (i.e. dB/dt limits) all must be considered. Compromises must be made. For example, a very linear field gradient coil tends to be high in inductance and requires a high voltage power supply to provide a high slew rate. A coil which produces a linear gradient field over a large field of view for spinal imaging can produce excessive dB/dt when driven at a high slew rate. The efficiency (and hence heat generation) is better when a smaller gradient coil having a reduced diameter or shorter length is employed. Smaller diameter gradient coils are used, for example, when imaging the head with fast EPI pulse sequences.

A number of solutions have been proposed to address this gradient subsystem design dilemma. As described in U.S. Pat. No. 5,311,135, for example, the gradient coil windings may be tapped and the gradient amplifiers can be switched to different taps on the coils depending on the particular scan being conducted. Such switching changes the size and location of the optimal gradient fields as well as the electrical characteristics of the coils. In another solution described in U.S. Pat. No. 5,736,858, two separate sets of gradient coils are provided and the three gradient amplifiers may be switched to either or both sets depending on the particular scan being performed. One set of gradient coils is a relatively large, whole-body coil and a supplementary gradient coil set is relatively small. The gradient amplifiers have fast semiconductor switches capable of rapidly switching between three gradient coil configurations within a pulse sequence.

In yet another solution disclosed in co-pending U.S. patent application Ser. No. 09/382,905 filed on Aug. 25, 1999 and entitled "*Modular Gradient System For MRI System*" separate sets of gradient amplifiers are used to drive the whole-body gradient coils and a supplementary gradient coils set. Both gradient coil sets can thus be employed separately or at the same time during an imaging pulse sequence.

For a number of imaging applications the supplementary gradient coil set is used because they are specifically designed for the application. Such supplementary gradient coil sets typically have a limited field of view over which their gradient fields are uniform. This can be a disadvantage for applications which require spatial localization near the edge or outside of the imaging volume. For example, spatial saturation as described in U.S. Pat. No. 4,715,383 is often applied near the edge of the field of view. If the Supplementary coil is used for both spatial saturation and imaging gradients, the spatial saturation pulses will only be effective over a small, limited volume.

In another clinical application, Fast Spin Echo (FSE) sequences are used to image spines with sagittal planes. Phase encoding is typically S/I to prevent cardiac, flow and respiratory motion artifacts from overlaying the spine image. Because the patient usually extends outside the field of view, phase encode oversampling, which doubles the field of view ("No Phase Wrap"), is often used to avoid aliasing or wrap-around artifacts in the phase encoding direction. However, there is an artifact which is aliased into the field of view even when phase encode oversampling is used. This artifact is caused by a combination of B0 field inhomogeneity and gradient nonlinearity in the region beyond the normal imaging volume. Typically, the B1 field is strong enough in this area to flip spins, but insufficient gradient amplitude is available to properly frequency and phase encode the spins. The artifact is a bright spot which may be spread into a ghosted pattern because of system instabilities, eddy currents, and echo amplitude modulations which are typical in a FSE pulse sequence. Specifically this artifact will be highly visible when the supplementary coil set is used. Spatial saturation pulses (spoilers) applied at sufficient amplitude and duration could eliminate this artifact. However, this would not work with the supplementary coil because the gradient field is very weak in the region from which the artifact emanates.

Another application of spatial saturation at or near the edge of the field of view is brain perfusion imaging. Two images, with and without spatial saturation of the carotid arteries, are acquired and subtracted. Poor spatial saturation results in under-estimation of brain perfusion.

Yet another application of spatial saturation is 3D Time of Flight angiography with very thick slabs. This technique does not typically use a spatial saturation pulse, however, the use of a superior spatial saturation pulse can reduce signal from venous flow and improve conspicuity of arterial vessels.

Another application of gradient waveforms for localization at or near the edge of the field of view is the use of navigator pulse sequences to acquire signals from the diaphragm when performing cardiac imaging to synchronize scanning with respiration. Poor gradient linearity results in an incorrect location and field of view for the navigator signal with resulting poor scan synchronization.

SUMMARY OF THE INVENTION

The present invention is a method and apparatus for optimizing the use of a whole-body gradient coil system and a supplemental gradient coil system in clinical imaging applications where image data is acquired from a region of interest within the optimal range of the supplemental gradient coil system, and additional gradients are required to affect spin magnetization outside the region of interest. More particularly, the supplemental gradient coil system is operated during a series of imaging pulse sequences in which NMR signals are acquired from the region of interest, and gradient pulses produced by the whole-body gradient system are interleaved with the imaging pulse sequences to affect spin magnetization outside the region of interest. The interleaved gradient pulses may, for example, be employed as part of a spatial presaturation sequence or as part of a navigator pulse sequence in which transverse spin magnetization is produced in specific locations outside the region of interest.

DESCRIPTION OF THE PREFERRED EMBODIMENT

Figure 1:
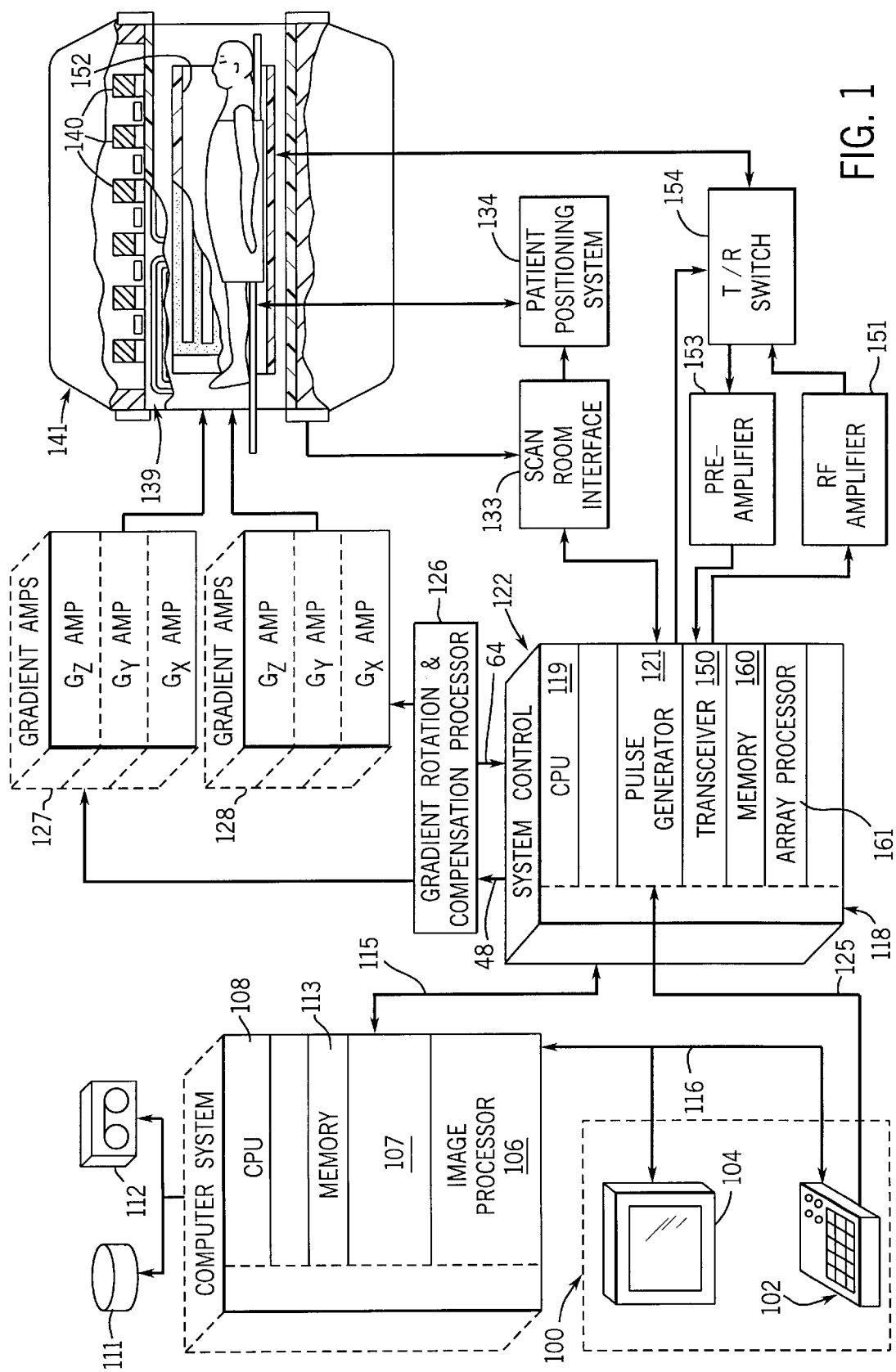
FIG. 1 is a block diagram of an MRI system which has been programmed to practice the preferred embodiment of the invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window.

The pulse generator module 121 also produces gradient waveforms which indicate the timing, strength and direction of the magnetic field gradients produced during the scan. These are "logical" gradient waveforms for the respective X, Y and Z axes and they are applied to a gradient rotation and compensation processor 126. As will be described in more detail below, the processor 126 rotates the logical gradient waveforms as needed to produce physical X, Y and Z gradient waveforms, and these physical gradient waveforms are compensated for eddy current errors and applied to a set of primary gradient amplifiers 127 and a set of supplementary gradient amplifiers 128.

The pulse generator module 121 also connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The two sets of gradient amplifiers 127 and 128 drive gradient coils in an assembly generally designated 139 to produce the magnetic field gradients used for position encoding acquired NMR signals. As will be described in more detail below, the gradient coil assembly 139 includes a set of primary, whole body gradient coils driven by gradient amplifiers 127 and a set of supplementary gradient coils driven by gradient amplifiers 128. The gradient coil assembly 139 forms part of a magnet assembly 141 which includes a polarizing magnet 140 and a whole-body RF coil 152.

A transceiver module 150 in the system control 122 produces pulses which are amplified by an RF amplifier 151 and coupled to the RF coil 152 by a transmit/receive switch 154. The resulting NMR signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
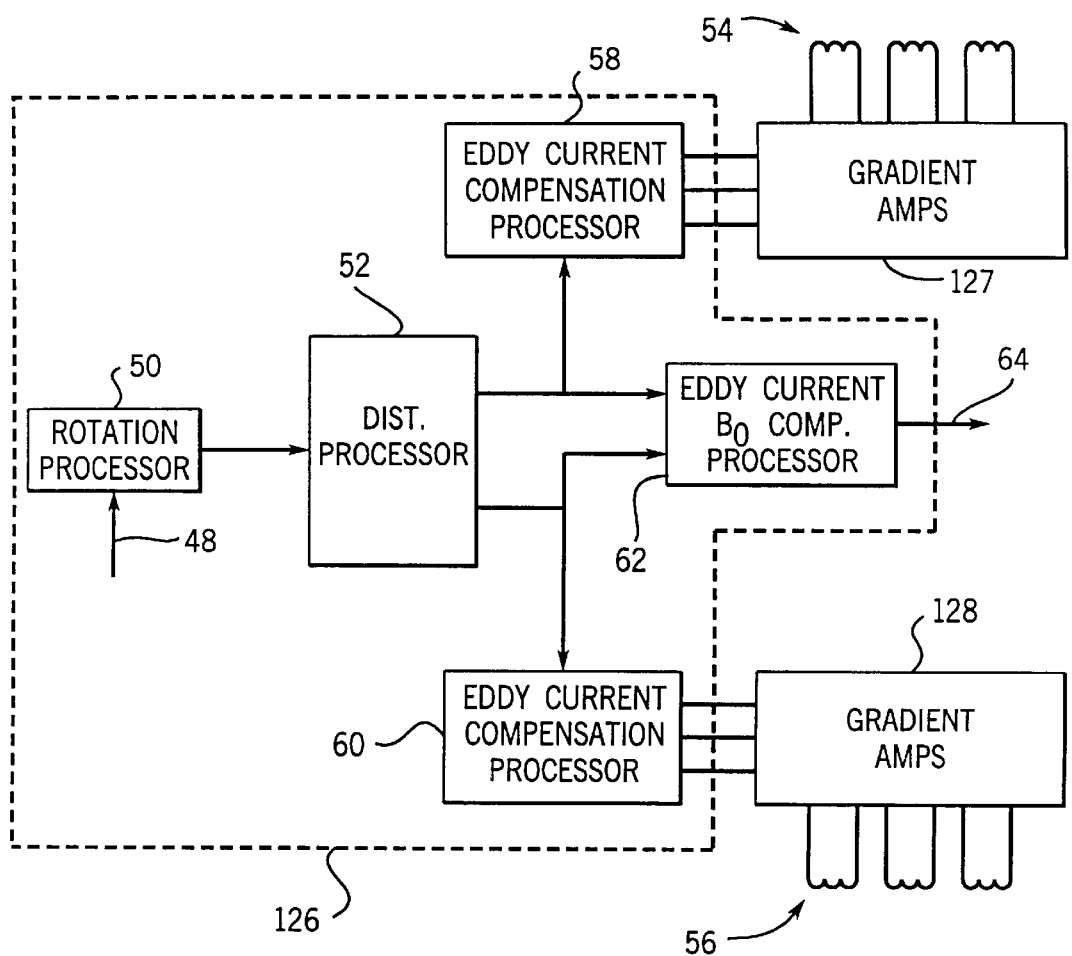
FIG. 2 is an electrical block diagram of a gradient rotation and compensation processor which forms part of the MRI system of FIG. 1.

As described above, the pulse generator 121 produces "logical" gradient waveforms that generate the slice-select, phase encoding and readout magnetic field gradients during a scan. Referring to FIG. 2, these three logical gradient waveforms are input to the processor 126 at 48 and converted into X, Y and Z "physical" gradient waveforms by a rotation processor 50. Each logical gradient waveform is rotated in space to produce gradient waveform components along one, two or three of the physical gradient axes X, Y and Z. This rotation is controlled by the prescribed scan which indicates the orientation of the image slice, or slab in space.

The three physical gradient waveforms $G_x$, $G_y$ and $G_z$ are applied to a distribution processor 52 which produces corresponding physical gradient waveforms for a first set of gradient coils 54 and a second set of gradient coils 56. In the preferred embodiment the gradient coil set 54 is the primary gradient coil set and the distribution processor 52 multiplies the input physical gradient waveforms by a factor ($\alpha$) which produces an optimum gradient field strength for the three primary gradient coils in the gradient coil assembly 139. The distribution processor 52 also multiplies the same input gradient waveforms by a factor ($1-\alpha$) to distribute the remaining portion of the physical gradient waveforms to the supplementary gradient coil set 56.

As is well known in the art, gradient fields produced by gradient coils located near conductive structures induce Eddy currents in those structures. The Eddy currents in turn produce their own magnetic field gradients which combine with the prescribed physical gradient waveform to distort the resulting magnetic field gradient seen by the imaged subject. Consequently, the prescribed physical gradient waveforms must be compensated to offset the errors produced by these Eddy currents. Such Eddy current compensation circuits are described for example in U.S. Pat. Nos. 4,698,591; 4,950,994; 4,978,919; 5,025,217; 5,451,877; 105,455,512 and 5,770,943. Different gradient waveforms are usually sent to each coil. Since different gradient waveforms produce different Eddy currents, each gradient coil must be separately compensated. In the preferred embodiment a digital Eddy current compensation processor 58 is provided to compensate the physical gradient waveforms for the primary gradient coil set 54, and a digital Eddy current compensation processor 60 is provided to compensate the physical gradient waveforms for the supplementary gradient coil set 56. The compensated primary gradient waveforms are applied to gradient amplifiers 127 that produce the corresponding currents in the primary gradient coils 54. Similarly, the compensated supplementary gradient waveforms are applied to gradient amplifiers 128 that produce corresponding currents in the supplementary coils 56.

As is also well know in the art, the Eddy currents also disturb the polarizing magnetic field $B_0$. To compensate this disturbance an Eddy current $B_0$ compensation processor 62 connects to receive the distributed gradient waveforms from the processor 52. Eddy current processor 62 includes a summation circuit (not shown) which combines the $B_0$ compensation current for both coil sets 54 and 56 into a single $B_0$ compensation signal at output 64. This $B_0$ compensation signal 64 may be used to drive a shim coil (not shown) which produces a compensating $B_0$ field, but in the preferred embodiment the signal 64 is used to modify an RF carrier signal produced by the transceiver module 150. Such Eddy current $B_0$ compensation processors are well known to the art as described for example, in U.S. Pat. Nos. 5,289,127 and 5,856,744.

Figure 3:
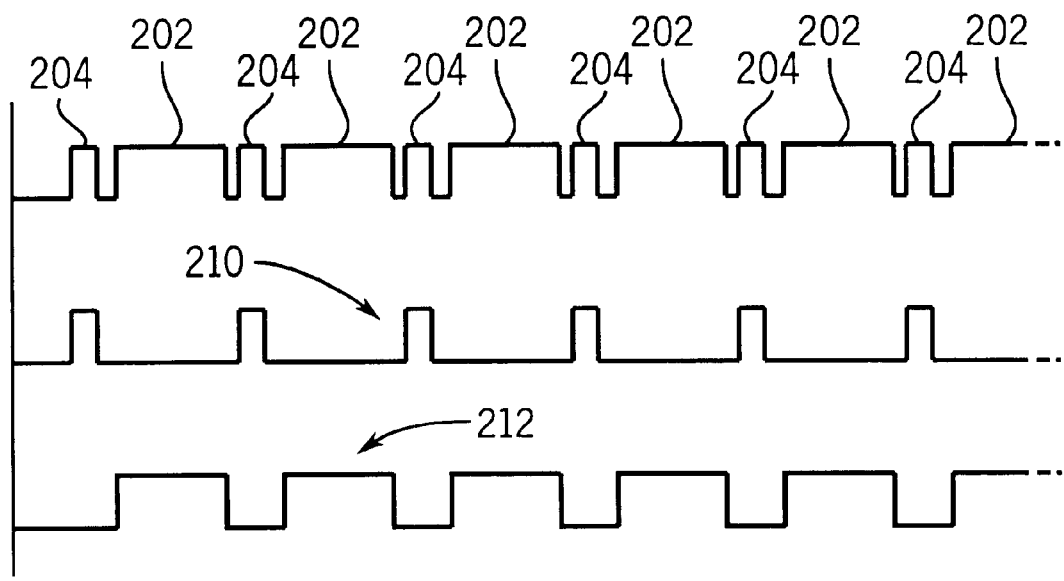
FIG. 3 is a graphic illustration of a scan performed by the MRI system of FIG. 1 in which the preferred embodiment of the invention is employed.
Figure 4:
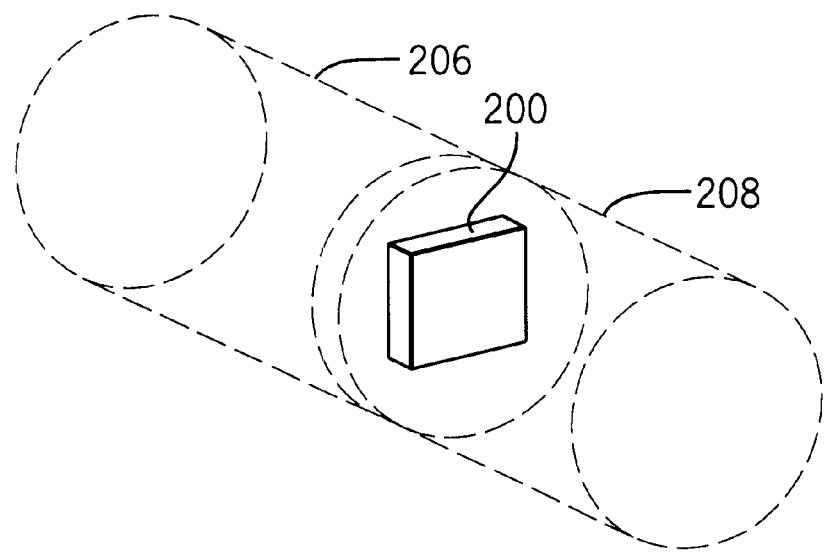
FIG. 4 is a pictorial representation of the region of interest from which image data is acquired during the scan of FIG. 3 and the surrounding regions which are saturated by presaturation pulse sequences.

Referring particularly to FIGS. 3 and 4, the MRI system is operated according to a prescribed scan sequence to acquire NMR signals from which an image may be reconstructed. Typically the image data is acquired from a specific clinical region of interest such as the patient's head, heart, spine, shoulder, knee, etc. Such a clinical region of interest is indicated at 200 and is usually substantially smaller than the imaging volume of the MRI system. The scan sequence includes an imaging pulse sequence 202 which is repeated during the scan to acquire different views by stepping one or more magnetic field gradients through a series of values. The present invention is particularly applicable when fast imaging pulse sequences are used such a fast spin echo ("FSE"), echo planar imaging ("EPI") or fast gradient recalled echo pulse sequences. In these applications a supplemental gradient coil set 56 is advantageously used to provide the gradient fields during the imaging pulse sequences. For example, a head coil such as that disclosed in U.S. Pat. Nos. 5,304,933 or 5,293,126 may be used, or a shortened gradient coil may be used.

In many applications, spin magnetization outside the clinical region of interest is affected during the scan by interleaved pulse sequences 204. One common example is the use of presaturation pulse sequences to suppress image artifacts caused by signals emanating from spins in the surrounding regions. As described in U.S. Pat. No. 4,715,383, presaturation pulse sequences include a selective rf excitation pulse that is produced in the presence of a magnetic field gradient to excite spins in one or more regions surrounding the clinical region of interest 200. Two such regions disposed axially to each side of the region of interest 200 are indicated by dashed lines 206 and 208 in FIG. 4. To ensure that these extended regions are properly saturated, it is a teaching of the present invention that the gradient fields produced during the interleaved presaturation pulse sequence 204 be produced with the whole-body, primary gradient coils 54. These gradient coils 54 have a much longer dimension in the axial direction than the supplemental gradient coils 56, and the gradient field which they produce is uniform over a much larger volume.

Referring particularly to FIG. 3, the two sets of gradient coils 54 and 56 are, therefore, alternately energized during the scan sequence. As indicated at 210 the primary, whole-body gradient coils 54 are employed during the presaturation pulse sequences 204, and as indicated at 212, the smaller, supplemental gradient coils 56 are employed during the imaging pulse sequences 202.

It should be apparent to those skilled in the art that variations are possible from the preferred embodiment described above without departing from the invention. For example, other pulse sequences such as navigator signal pulse sequences may be interleaved with the imaging pulse sequences. As disclosed, for example, in U.S. Pat. No. 4,937,526, such navigator signal pulse sequences include the application of a selective rf excitation pulse in combination with a gradient pulse and the acquisition of a resulting NMR signal. The acquired NMR navigator signals are used in a variety of ways to remove image artifacts from the image. In addition, a number of variations in the gradient system hardware is possible. For example, a single set of gradient amplifiers which are quickly switched between the two sets of coils 54 and 56 may be used during the scan to alternately produce gradient fields. In yet another hardware configuration the two sets of gradient coils are formed by switching to different taps on a single set of physical coils.

What is claimed is:

1. A method for performing a scan sequence with a magnetic resonance imaging system, the steps comprising:
    a) performing a series of imaging pulse sequences to acquire image data from a clinical region of interest, and including producing magnetic field gradients with a first set of gradient coils; and
    b) performing a series of pulse sequences that are interleaved with the imaging pulse sequences to affect spin magnetization in a region adjacent to the clinical region of interest, and including producing magnetic field gradients with a second set of gradient coils.

2. The method as recited in claim 1 which the series of pulse sequences performed using the second set of gradient coils are a series of presaturation pulse sequences.

3. The method as recited in claim 1 in which the series of pulse sequences performed using the second set of gradient coils are navigator signal pulse sequences.

4. The method as recited in claim 1 in which the imaging pulse sequences are fast spin echo pulse sequences.

5. The method as recited in claim 1 in which the imaging pulse sequences are echo planar imaging sequences.

6. The method as recited in claim 1 in which the imaging pulse sequences are fast gradient recalled echo sequences.

7. A magnetic resonance imaging system, which comprises:
    a) means for producing a polarizing magnetic field in an imaging volume;
    b) means for producing an rf excitation field in the imaging volume;
    c) a first set of gradient coils for producing magnetic field gradients throughout the imaging volume;
    d) a set of supplemental gradient coils for producing magnetic field gradients throughout a clinical region of interest located inside the imaging volume;
    e) means for acquiring NMR signals produced in the imaging volume; and
    f) a pulse generator programmed to operate elements b), d) and e) to perform a scan sequence in which a series of imaging pulse sequences are performed to acquire image data from the clinical region of interest; and to operate elements b) and c) to perform a series of interleaved pulse sequences that affect spin magnetization with in the imaging volume and outside the clinical region of interest.

8. The system as recited in claim 7 which includes:
    a first set of gradient amplifiers for driving the first set of gradient coils; and
    a second set of gradient amplifiers for driving the set of supplemental gradient coils.

9. The system as recited in claim 7 in which the set of gradient coils and the set of supplemental gradient coils each includes three separate coils.

10. The system as recited in claim 7 in which the series of interleaved pulse sequences are presaturation pulse sequences.

11. The system as recited in claim 7 in which the pulse generator also operates element e) during the series of interleaved pulse sequences to acquire NMR navigator signals.

* * * * *